United States Patent [19]

Davis

[11] Patent Number: 4,734,856

[45] Date of Patent: Mar. 29, 1988

[54] AUTOGENERIC SYSTEM

[76] Inventor: Dannie E. Davis, Rte. One, Box 266-C, Elmore, Ala. 36025

[21] Appl. No.: 585,403

[22] Filed: Mar. 2, 1984

[51] Int. Cl.$^4$ .............................................. G06F 15/20
[52] U.S. Cl. ...................................... 364/300; 364/513
[58] Field of Search ................................ 364/300, 513

[56] References Cited

U.S. PATENT DOCUMENTS 4,286,330  8/1981  Isaacson .......................... 364/300 X
4,479,241 10/1984  Buckley ........................... 364/513 X

*Primary Examiner*—Raulfe B. Zache

[57] ABSTRACT

The invention of the "autogeneric system" in the form of <<dada 83>> is a closed recursive manufacturing cycle. Present technology is probably sufficient to build fifth generation computing systems, but the actual construction of inductive and deductive logic machines awaits the discovery of real methods. The working model <<dada 83>> operates by the relentless application of directed trial and error. The operation of <<dada 83>> has been directed to produce "better" versions of <<dada 83>>.

The copyrighted version of <<dada 83>> can be used to manufacture microcomputer systems, and process control systems. The value of "autogeneric systems" rests in the inherent ability to create or manufacture complex systems on demand. The ability to incorporate expert knowledge into reusable modules allows a multiplication of the efforts of experts. The error detection allows real telecommunications networks to be used to create a distributed computer.

2 Claims, No Drawings

AUTOGENERIC SYSTEM

HISTORY

I am a scientist. For the last decade I have been interested in a fully automatic system that would handle all portions of the manufacturing process, beginning with raw material.

In 1978 after completing several assemblers and compilers, I began experimental research into artifical intelligence (AI). The first step was to review all work to date and formulate a plan of action. The literature revealed that advances in hardware stimulated discovery for a short time, then the limitations of the hardware would choke progress. The exception to this pattern was LISP. The fundamental correct concepts in LISP are a virtual machine divorced from the physical hardware, and an extensable language for this virtual machine.

My plan was to make a virtual machine that used all of the physical hardware resources, but intervened to extend the virtual machine using the "writable control store" technique. I perceived that one fundamental procedure was crucial to success, the ability to self-organize. Before the end of 1978, a working program was produced. The first model loaded a knowledge base of a language then operated as that language until a different knowledge base was loaded. The internal operations were similar to LISP but the external operation was only defined by the learned knowledge base. Testing this model was difficult and I resolved to make the next program able to test its' own knowledge base.

Much of 1979 was occupied in developing procedures to certify, verify, and authenticate data files used as intermediate carriers. Signature analysis and reverse cryptography were used to solve those problems. The self-organising process was studied and a compact module was developed (groak) that solves multidimensional directed graph networks. These developments also made the virtual machine temporially and spatially expandable. The temporial expansion of a task allows limited hardware to process a task of unlimited complexity by using secondary storage to hold intermediate products. The spatial expansion of a task allows an unlimited number of single computers to process portions of the products in parallel, and exchange products by telecommunication networks.

The autogeneric system has been doubling in size and complexity about every three months while in use. One practical development has been the "Silicon Scribe", a device that manufactures single chip computers from high level specifications. The autogeneric system has been used to bootstrap from a crude interpreter that operated on virtual machine instructions to the <<dada 83>> "archive", a self replicating computer manufacturing system.

Status

The <<dada 83>> Autogeneric system "archive" was sent to the Library of Congress for copyright registy the tenth of January 1984. The registry process may take until April to return the registration certification. Registry with the Library of Congress permits all librarys to obtain and loan copys of <<dada 83>>, but enables enforcement of federal copyright laws. The patent application for "Autogeneric Systems" uses the <<dada 83>> "archive" as the "working model" required to fully explain the invention and process to be patented. The patent application is required to be submitted in less than one year of the publication of a device or process. The <<dada 83>> archive was "published" on Dec. 30, 1983. The "Autogeneric System" invention and process can used to select raw material, collect and process raw material into either intermediate forms, or into a final selected form (complete manufacturing from dust to product).

Self-organising Systems

There are several usefull studys of self-organising systems from 1949 to 1979. There are two common conclusions about the key features of self-organising systems; (1) They are not isolated systems: they draw energy and material from their surroundings (they feed), and (2) They are complex systems of many interacting parts (usually thousands of parts), and the interactions must be nonlinear (the interactions follow catasthropy theory).

References (1) C E Shannon and W Weaver, "The mathematical theory of communication", University of Illinois Press, 1949.

(2) C Nicolis and I Prigogine, "Self-organization in Non-equilibrium Systems", John Wiley & Sons, New York, 1977.

(3) H Haken, "Synergetics", Springer-Verlag, Berlin, 1977.

(4) "Byte", June, July, and August, 1979.

Autogeneric System

"Autogeneric Systems" are self-organising systems similar to, or derived from "<<dada 83>>". "Autogeneric Systems" must be able to create or manufacture exact duplicates of themselves, and be able to create or manufacture altered duplicates of themselves that have properties that the parent did not contain or express.

Times' arrow is cruel to the works of man; moths and rust follow his hand. Metal fatigues and crystals fracture; moving parts won't and protection systems don't. Sages state wisely that all moves to rack and ruin.

An acorn falls to fallow ground. Warmed by sun and wet by rain, enzymes unwind the coiled genes. Transfer nuclease both controls and is controlled by the statistical nudging of hydrated proteins. The substance of the earth is molded with the sky and sun to rise high above the ground.

Research into "artifical intelligence" raises the real question: "What is intelligence, and how does it operate?" My work is based on the premise that intelligence is neither a property of special systems, nor a process. The answer is simply that we say that intelligence is present when we observe that the actual outcome of events is different from the expected statistical enthropic result. Intelligence is not a process, but the effects of intelligence can be obtained by creating a system of many parts that interact in nonlinear or catastrophic mode. A self-organising system that can replicate its working parts and manufacture a duplicate or similar system is an "Autogeneric System".

Bind

"Bind" is a recursive linker that allows machine code to self-compile and resolve symbolic references into an overlay template.

"Bind" is a knowledge base module that combines virtual overlay template modules in a catastrophic and irreversable way. The least likely outcome is for the combined virtual overlay template to have the same combinatorial capability as both precursor modules. The actual combination is used to convert the potential network of overlay template modules into a usefull overlay template that is the physical embodyment of the solution of the multidimensional directed graph network of the origional modules.

Exclusive Virtual Overlay Process

The "Exclusive Virtual Overlay Process" instantly reconfigures the resources of a computing system by transferring exclusive and privledged control to an absolute run code program created by linking an overlay template to the run time library of system resources. The system may invoke this same process to "chain" to any overlay template. A default template is invoked to allow external control of the "chaining" of overlay templates.

The exclusive overlay execution process is an internal writable control storage virtual instruction in the virtual computer kernal. This knowledge base module is given transient control of the computing system to convert an overlay template to absolute run code, linked to the system resources. The operation is completely catastrophic in terms of a finite state machine. The process obliterates the previous control program in order to execute a program that is not directly linked to the hardware that will be used. This novel and usefull process gives the total system extreme agility and flexibility.

Gosamer

"Gosamer" is a fixed format for the transmission, storage, and procesing of data. The parallel format consists of a block identifier folowed by a block skip size, then the actual block of data. The block of data has the internal structure of the actual data folowed by an end of file mark, ending with a digital signature of the data stored in the block. The serial format has the same major structure and is preceeded by a block synchronizing signal before the block identifier. The binary carrier of data on the communication channel is symetrical square waves of constant amplitude of two different periods. Zero bits are conveyed by the shorter time duration, and one bits are conveyed by the longer time duration.

"Gosamer" is the fundamental substance of a complex self-organizing system. The invention of one single type of information carrier is nessary to allow intermediate data products and final results to be handled and managed. Both storage and communication are made to have compatable formats. This compatability allows storage and communication to be used interchangably. A project that is physically too large for the storage and speed of one computer node can be communicated to other computer nodes for parallel processing. A project that is too big for the primary memory of a computer node can use secondary storage for both data and intermediate results, thus allowing the use of off line storage.

The importance of the integrity of data conveyed by gosamer requires that any alteration of data during storage or communication be detected. The signature of the data permits a high degree of certainty that the data contents are unaltered. The computing node is responsible for recovering from detected bad data.

Groak

"Groak" is a multidimension directed graph network organizer. "Groak" acts to self-organize complex multidimensional networks of objects with directed characteristics.

"Groak" is a novel and usefull process that can develop a plan of construction. The description of isolated knowledge base modules often have a symbolic reference to other isolated knowledge base modules. This property makes the assembly process important, similar to the requirement to build the walls of a house before building the roof. Each symbol that is used doubles the possible ways of assembling modules, a combinatorial explosion. "Groak" is a knowledge base module that evaluates a list of potential overlay templates, and attempts to solve a multidimensional directed graph described by the network list. If the process is successfull the list of potential overlay templates is rearranged so that "bind" can generate a single overlay template from the list of leaves. If the network is unresolved, then the names of the unresolved leaves are displayed. The list of unresolved leaves allows the network to be corrected.

Phrase Recognition

The claim of the invention of "Phrase Recognition" is limited to the application of phrase recognition (or lentactical decoding) in knowledge based modules of a computing system. Phrase recognition allows partial or exact pattern recognition with "noise" terms included in the analysis.

There are three steps in converting symbolic representation into physical results. First, the symbolic representation is separated into structure and content. The structure conveys the knowledge of the relationship between the elements of the content of symbolic representation. The second step applys rules to the structure, the contents, and their relationship to build a model of the intent and purpose of the symbolic representation. The third step involves selecting a physical structure (or creating one) that fulfills the intent and purpose of the symbolic representation.

Phrase recognition, used in knowledge base modules, accepts a list of objects (symbols and numbers), and applys local rules to analyze the list of objects. The recognition of exact or partial matches often cause the list of objects to be reorganized and edited. Direct action can also result from phrase recognition.

Signature Compression of Alphanumeric Strings

The "Signature compression of alphanumeric strings" is a novel and usefull process that is a variation of table "hashing" for string storage. The procedure of table "hashing" uses some technique to convert the characters in a string into an address in a table of strings. If the entry is filled, then a procedure is invoked to seek another table location untill an empty space is found to store the string. "Signature compression of alphanumeric strings" converts the binary pattern of a string into a digital signature. This signature is used as the string for all comparisons or symbol representation. The actual source string is not stored.

Signature analysis is used to convert sequences of binary states into a unique value that can be stored or compared. Signature analysis is used to quickly evaluate the operation of complex digital systems by allowing the immediate determination of the operation of component sections of the digital system. The digital signature is obtained by combining the synchronized input binary data with the data circulating in a pseudo-random sequence generator. This procedure gives any desired degree of certainty that the input synchronized binary data is either identical to a reference synchronized binary data sample, or that it is different. The number of bits in the pseudo-random sequence generator determines the reliability of the comparison. A sixteen bit sequence generator, for example, gives and accuracy of one part in sixty-five thousand, or the reciprocal of the power of two to the number of bits in the sequence generator. A sixty-four bit sequence generator is accurate to one part in a billion.

The statistical nature of signature analysis causes different source strings to have the same result. These "collisions" can not be detected after the source string is thrown away. The number of bits used for symbol signatures is a compromise between accuracy and the storage space used, however even a sixteen bit symbol signature provides enough distance between "collisions" to be usefull in developing large systems.

Silicon Scribe

The "Silicon Scribe" is a system that performs the final manufacturing stage to apply single chip erasable and reprogrammable computers to specific uses. The "Silicon Scribe" Translates a symbolic representation of the application for the single chip erasable and reprogrammable computer into the exact steps to cause the single chip to operate in accord with the symbolic representation of the application, and causes these steps to be applied to a specific device.

Spore

"Spore" causes the active and essential components of an "Autogeneric System" to be impressed upon a non-volatile media, for example into a programmable read only memory device.

The "spore" knowledge base module has the primary function of reproducing "Autogeneric Systems", but may be used to manufacture special purpose systems. The operation of "spore" manufactures a two phase system generator. The "injector" is a simple program that installs the "embryo" system. The "embryo" system is derived from an "embryo" overlay template that is directly linked to the target system hardware. The "embryo" system can also load files stored by "spore" for the "embryo's" use in the target hardware. A specific system can be created for target hardware, word processing or process control for example, using "spore" to package the "embryo" overlay template and auxillary files that will mesh directly with the target hardware.

Unified Parser

The Unified Parser" combines the functions of a token recognizer and a syntax recognizer and a numeric translator into a single module that converts an input text string into a stack of objects (symbols and numbers) that may be used by other knowledge based modules as input.

The "unified parser" operates several knowledge base modules in parallel to convert an input text string into a stack of objects, either symbol signatures or numbers. The set of decimal characters is {−,0,1,2,3,4,5,6,7,8, and 9}. The set of hexadecimal characters is the set of decimal characters plus {A,B,C,-D,E,F,H, and h}. The set of alphanumeric characters is {(0 ... 9), (A ... Z), (a ... z), and "−"}. The initial classification of each token is as a decimal number. If any characters outside the decimal set are encountered in the token, then the token is classified as a hexadecimal number. If any characters outside the hexadecimal set are encountered in the token, then the token is classified as alphanumeric. If the final classification of a token is numeric, then any hyphen collected will cause the negative value of the number to be stored. The storage of symbol signatures and numbers is recorded in the sequence that they are encountered. Other knowledge base modules can use this processed information for fast evaluation of the symbolic representation of the input text.

Virtual Computer Kernal

The "Virtual Computer Kernal" performs memory management using content addressable files, and contains the system device drivers. Included in the system device drivers are high level language microcode routines used as writable control storage. The high level microcode routines extend the virtual machine code to directly execute an unlimited extensable virtual computer. The high level microcode routines can be used to correct defects in the design of the central processing unit instruction execution, or other hardware defects or limitations.

Asteroid Mining Ltd. Research & Development Operating Environment <<dada 83>>

Copyright 1983 by Dannie Earl Davis Distributed by Asteroid Mining Ltd.

This is the first ever release of a complete operating environment. You are used to software packages that are supposed to work with specific machines. You seldom get the source code with software that you lease, and you almost never have access to the tools that were used to build the software. Asteroid Mining Ltd. is making its research & development operating environment available to you in a fantastic package that contains (1) a virtual extensable hardware overlay kernal, (2) an incremental interactive extensable compiler, (3) a word processor, and (4) extensive disk and tape utilities. The eight inch single sided single density "archive" disk contains the source code for these programs, help files, and immediate operation modules for the "Ferguson" single board computer equiped with ASCII keyboard, video monitor, and 8" disk drives.

The <<dada 83>> Autogeneric System is composed of knowledge based computing modules with phrase recognition. The "kernal" hardware overlay uses the native machine code, but overlays higher levels of operation using an exclusive virtual overlay technique. This "kernal" emulates an extensable virtual machine hardware that can not be built today. The Autogeneric System can be transported to any computer system that uses 8080, 8085, Z-80, Z-800, 8086, or 8088 central processing units and has more than 32k bytes of volatile memory. Other computers can also install an Autogeneric System, but extensive modification may be required. The "archive" disk contains all of the source code for the major modules of <<dada 83>>, disk duplication program, and the tools nessary to build a new "kernal".

The minimum hardware configuration is a "Ferguson" single board computer operating with an ASCII keyboard, dual 8" disk drives, and a video monitor. The «<dada 83>>» operating environment pushes the central processing unit to the limits of performance and will cause marginal timing faults in the hardware to have severe effects on "dada" operation.

The "dada" workstation with the "zot-rock" 16k ROM cartridge installed has "instant on" operation. The video screen should blank and have a program identifier message centered on the screen. When you press a numeric key (0 ... 7) the system prompt ">>>" is displayed on a new line and you can perform any valid system operation immediately. If you want to activate the "archive" disk, then insert the disk in a drive and type the command (boot). The disk should mount and the memory allocation should be displayed. Memory will be recovered by keeping "dada" and "script" on the disk until you need them.

The system documentation is on the "archive" disk in "help-" files. These files are printed by the "print" program in the "script" word processor. The "script" file set must be loaded from disk (get script) along with the desired "help" file (get help), then the command string (print help) displays static pages of justified text, advancing when any key except return or escape is pressed. The return or escape keys cause the printout to terminate. When you are through looking at a "help" file, then erase the "help" file (glop by help), before loading and printing another "help-" file.

The "archive" disk contains help files for almost every object stored on the disk. The "help-cyber" file set describes the operation of the virtual computer kernal virtual instructions. These help files are available on the "archive" disk.

<<help-cyber>>

The "help-cyber" file is the root help file for the "cyber" virtual computer. The sub-files of "help-cyber" or help- (calculate, display, files, keyboard, string, and system).

<<help-demo>>

The "demo" file is designed to introduce you to the <<dada 83>> operating environment.

<<help-3>>

Disk-3 contains the hardware overlay "kernal" and the tools required to create a new "cyber" virtual computer.

<<help-4>>

Disk-4 contains the SHared Arbitrated Resources (shar) that are the fundamental command verbs used by all programs.

<<help-5>>

Disk-5 contains "dada" an incremental interactive extensable development system.

<<help-6>>

Disk-6 contains the "script" word processor.

<<help-7>>

Disk-7 contains the "utilities" to operate the disk and tape systems effectively, and contains naked hardware drivers.

The ten disk storage module system defines the use of the disk volume numbers zero to nine. Disk zero is a work or scratch disk and should contain your current work in progress. Disk one is your scratch storage, backup for the work disk. Disk two is the documentation backup disk, disk eight and nine are the program source backup disks. The disks three to seven are divided into functional groups, these are the active system disks. The active system disks contain a master help file and both the program source and compiled modules for system verbs. This plan makes it almost impossible to loose information. The disk contents are tracked by a two phase audit that insures that you can know everything that is on each disk, or any file that is not on a disk. The "archive" has the volume number of 200. You are free to use the volume numbers from ten to 199 for any purpose that you wish.

<<virus>>

The "virus" is an external recursive loader program, (residing on the "archive" disk) that operates with PFM 3.3 (the CPM loader and monitor 2716 EPROM, distributed with the "Ferguson" single board computer). The "virus" infects a system when the system command (* b) is given to boot the "archive" disk. The monitor returns and prints an error message (disk error 00001000). The command (* g80) causes the virus fragment at 80h to execute and read itself into memory starting at 80h. The "virus" executes and mounts a disk and gets the "shar" and "cyber" files. The "cyber" file is linked to the absolute maximum address. (F000h) then the "shar" file and the "disk-index" become the active file-stack. Control is passed to the "cyber" run-time absolute machine code. The initialization sequence places the program identifier on the video screen and waits for a key press of a numeric key (0 ... 7) to begin normal operation.

The PFM 3.3 monitor will be activated with each system reset. Control can be passed to <<dada 83>> with the command (* g0). You can use the PFM 3.3 monitor to test, examine, or alter memory.

<<disk 3. cyber file set and tools>>

The entire concept of "Autogeneric Systems" begins at levels of symbolic abstraction far above language, speech, or writing. The foundation of "Autogeneric Systems" are two abstract concepts that are alien to normal experience with matter, energy, space, and time; the "solion" and the "instanton". The "solion" describes a local condition that causes the local condition to propigate forever without abatement. An astrophysical example of a "solion" is a black hole in space. The metaphysical expression of the "solion" is the state of being. The physical expression of the "solion" is LIFE.

The "instanton" describes an asymetrical impulse that carries no energy and appears at all points in space at the same instant. If you understand that time and space are part of a whole space-time, then the "instanton" will appear in space-time as interactions of the weak force to maintain the local planks constant. Time becomes compressed when energy is being transformed from potential to kinetic and time becomes weaker where energy is being transformed from kinetic to heat. If Both transformations happen at the same place the probability is disturbed. The physical expression of the "instanton" exists when energy patterns are copied (time compression) reducing the local entropy, or when energy patterns are combined in an irreversible way, like addition and subtraction (time expansion). The influence of the "instanton" is to cause the basic time unbalance to be increased in the strongest region, normalizing less powerfull regions. The increase continues until a discharge is made possible by the conversion of the time stress to a form of energy.

<<boot>>

The "boot" program resides in the 16k ROM cartridge of the Asteroid Mining work station. This program seeks the highest number disk drive with a <<dada 83>> disk. The disk is mounted and the "shar" file set is loaded from the disk.

<<cyber>>

The "cyber" file becomes the run-time kernal. This program simulates the operation of a computer that can not be built today. The "cyber" kernal uses both associative memory and content addressable memory, the arithmetic and logic are extended by pattern recognition, and a symbol extension to addressing. The "cyber" kernal is a directly extendable, and user modified advanced hardware concept.

<<disk>>

The "disk" file is the hidden compilation module of the disk driver software. This technique allows system software to be easily moved to new hardware configurations, by providing standard external linkages to the hidden package. There are three entry points to the "disk" file; unit, read, and write. The "unit" entry allows a numeric argument in the -a- register (0...7) to select the disk drive for all disk operations, however FF in the -a- register is a diagnostic that reads a header and returns with the memory pointer to the header in the -hl- registers. The "read" entry and the "write" entry begin with a block number in the -a- register (0...153) and a memory pointer in the -hl- registers. Any error will cause the carry flag to be set, but a correct operation will return with no carry and the -de- registers loaded with the block size. Both the "read" and "write" operations are given three chances to work right.

<<dot>>

The "dot" file evaluates a list of names and reports any collisions of the hash values (signatures of the names). This is used to test sets of names before building a large program or multiple-file set on disk. If you use names that collide, then you will suffer data loss and frustration.

<<flags>>

The "flags" file is used from the operating environment kernal to allow single step operation of programs with the "step" instruction (really the RST-7 instruction). All of the registers are displayed and the flag status is decoded. The program counter is displayed relative to the origin of the active program, the same value as the relative address displayed in the link-code file. The return or escape keys transfer control back to the operating environment, any other key will cause the execution to resume with the registers perfectly restored.

<<know>>

The "know" file uses the "source" text file to produce the "felix" file, (the internal data base for phrase recognition) and tests and data-base for duplications. The "source" file is a text list of the phrase recognition format for the machine language instructions generated by "zap". There are exactly 256 phrases in the text list, a phrase for each of the 256 eight bit values (undefined or illegal op-codes have the "null" phrase). The "felix" file contains the internal data-base for the "zap" file, and is a link code file.

<<linker>>

The "linker" file is part of the "cyber" program. This file acts as a linking loader to convert link-code file data into absolute run-time machine code in the overlay area. If the process completes without any errors, then execution passes to the new overlay program, else the message "serious linkage error" is displayed and the default overlay program "command" is linked and executed.

<<mesh>>

The "mesh" file allows you to make read only memory programs very simply. The command format is (mesh list into file-name). The "list" is composed of two types of entrys; (1) program setting constants, and (2) named data elements of variable size. The program setting constants define the beginning of a segment of volatile memory that the read only program will use. You can use as many different segments as you wish by using the address of the memory as the entry. Example; 300h, sets the program counter at three hundred hexadecimal. The named entrys contain both the element name and the element size as bytes. Examples; element-name 2, defines the size of the named element as two bytes. When you want to convert a program into a read only memory, you must construct a list of variables and scratch memory for the program to use.

The "file-name" can either be a single link-code file or a file set of link-code files. Running the mesh program converts the symbols defined in the data list into absolute values.

<<shazam>>

The "shazam" file converts a text list into two link-code files. The "shazam" file is used to convert an "a-name" list of objects into the two link-code files nessary to generate the "global-table" in the kernal. After the "shazam" operation, you use the rename command to separate the generated link-code files (rename a-name x-name). The "x-name" file contains pointer triplets generated from each object name in the origional text list. The "a-name" file is a link-code table indexed by complex pointers in the "x-name" file.

<<virus>>

The "virus" is an external recursive loader program, (residing on the "archive" disk) that operates with PFM 3.3 (the CPM loader and monitor 2716 EPROM, distributed with the "Ferguson" single board computer). The "virus" infects a system when the system command (* b) is given to boot the "archive" disk. The monitor returns and prints an error message (disk error 00001000). The command (* g80) causes the virus fragment at 80h to execute and read itself into memory starting at 80h. The "virus" executes and mounts a disk and gets the "shar" and "cyber" files. The "cyber" file is linked to the absolute maximum address, (F000h) then the "shar" file and the "disk-index" become the active file-stack. Control is passed to the "cyber" run-time absolute machine code. The initialization sequence places the program identifier on the video screen and waits for a key press of a numeric key (0...7) to begin normal operation.

The PFM 3.3 monitor will be activated with each system reset. Control can be passed to <<dada 83>> with the command (* g0). You can use the PFM 3.3 monitor to test, examine, or alter memory.

<<shar (Shared Arbitraited Resources)>>

The "shar" file set contains programs that operate the disk and tape storage systems, and programs to directly manipulate files in memory. <<dada 83>> is only one expression of a transfinite number of operating environments. The inclusion of the working source code and operating instructions with the release of <<dada 83>> causes any person that operates, modifies, or in any way uses any part of <<dada 83>> to be solely and completely responsible for any incidental, direct, or consequential damage or loss.

<<browse>>

The "browse" file allows you to examine a file set. The "see" file is limited to a single file because the three different file types require "see" to chain to the "look" file if the named file is not text. The "browse" program takes control from the "command" file and offers to let you browse through the files in a file set, one by one. You can abort the "browse" program by entering the "escape" key, or you can choose to skip the current offered file by entering the "return" key. Any other key causes the offered file to be displayed by the "see" program. This program can be used as a template for a batch control program.

<<command>>

The "command" file is the default overlay program. This program is often called a monitor or a system control program in computer systems, because this program is the means to cause the computing system to do usefull work. This program interacts with you by allowing you to enter a line of text (with backspace and cancell).

The command structure recognized by "dada 83" is similar to an imperative sentence, with the computer as the implied actor. The imperative sentence "put out the cat" has "You" as the implied actor, and the verb "put" tells you how to perform. The remainder of the imperative sentence contains parameters that modify the basic action and tell you what to act on (the object of the action). Every link-code file can be executed by using it's name as the verb in an imperative sentence to the command file. When you invoke a link-code file by writing it's name, the file is used to create an absolute run-time machine code program in the overlay zone. Program execution is passed to the new overlay program and the computing system has been totally reconfigured instantly to perform as an expert in a single or limited task.

The parameters entered with the command string are passed to the new overlay program to control the system operation. A specific example is (print letter out), the overlay program "print" seeks the root list "letter" and switches output to the line printer because the parameter "out" is in the command string. The positon of parameters in a command string decrease in importance from left to right. The parameter next to the verb is more important than the parameters further right. This organization allows each verb to take only the information that is vital to it's operation.

<<edit>>

The "edit" file allows you to create or modify text files. The display format is similar to "see" except all lines of text are numbered on the left, and the bottom line is the command echo line. The prompt of the command echo line lists all the valid commands (see, build, kill, copy). If you give an invalid command, the edit program terminates.

The "see" command must include a line number to display the static page of the text file (see 71). If you ask for a line past the end of file, then the display will begin at the end of file record.

The "build" command must include a line number to insert the text (build 37). You will be allowed to enter records (with backspace and cancell) using the return key when each record is done. When you are through entering records, the escape key terminates the text entry and the text is inserted into the file. The text buffer is set at two thousand characters, so it is unwise to enter more than a screen full of text at one gulp.

The "kill" command erases the record at the line number entered with the command (kill 53). In order to erase a group of records, enter the line number of the first record to erase then the line number of the last record to erase with the command (kill 97 105).

The "copy" command allows you to insert the contents of a text file into the file you are editing. This command requires a line number and a file name (copy 123 paragraph).

Any text file that is edited has the digital signature in the file shell set to null, this marks edited files as being altered. You should inspect the file contents and be satisfied that the file contents are correct before you "verify" the text file.

<<file>>

The "file" program reports on the size of files or file sets in memory or on a mounted disk. There are two formats of the "file" command; (1) the single file inquiry (file file-name), and (2) the file set inquiry (file by file-name). Both command formats give a blank response if the named file or set is not in memory or on a mounted disk. Also, both command formats will respond with the decimal size of the file or file set present in memory. If the named file or file set is not present in memory but is present on a mounted disk, then the decimal size is displayed preceded by an exclamation mark.

<<get>>

The "get" program transfers data from a mounted disk into memory. The command format is (get file-name). If the named file is not on the mounted disk, then "nope" will be displayed and the program terminates. If no disk has been mounted, then the "nope" exit will also be taken. If the wrong disk is in the drive the "?nope" exit will be taken, indicating that you need to either insert the mounted disk, or you must mount the disk in the drive. Correct transfer is signaled by a "... done" message. Hard errors are reported. See "mount" for more information on disk operation.

<<glop>>

The "glop" file uses three command modes to recover space and delete files. The simple command (glop) causes the "shar" file set to be preserved and all other files to be deleted. The command (glop file-name) deletes the named file. The command (glop by file-name) causes the file-set listed in the first file to be deleted. All correct operations of "glop" chain to the "mem" file to display the current memory allocations and usage.

<<load>>

The "load" file allows you to retrieve named files or file sets from cassette tape. The command format is (load file-name). The hardware must be operated correctly and the named file must be on the tape. The "escape" key can abort a load. If the file is correctly loaded, then a star (*) is displayed and the program terminates. The loaded program is not checked for major errors and defective tape or an aborted write on tape can cause the files to be damaged. Other file names cause a four digit hexadecimal value to be displayed. You should use the "verify" program to test files or file sets loaded from tape.

If you are loading a file set, it is wise to "glop" the files first. The files loaded from tape are in the top of the dynamic file que and the file search begins at the bottom. This will cause a file present before the load to overshadow a file with the same name loaded from tape. I have used this property to swap groups of files in file sets, but you should be aware that this behavior exists.

<<log>>

The "log" file allows you to keep track of your files on disk. The "disk-index" in memory and the "index" file from the mounted disk are compared, and differences are reported. Two reports are possible; "missing files from disk", and "unknown files on disk". If both lists match, then "perfect index !" is displayed.

Each entry in the "index" file contains a file-name and the file size. When the file is changed the file size will not allow a match, thus marking any files that have changed. You only need to backup the changed files. The size of the index entry will indicate any alteration of the "index" file. This double audit trail traces all changes of files on a disk.

<<mem>>

The "mem" file displays the current memory allocation. The disk is configured as extended memory and will be included in the display if a disk is mounted (see "mount"). The usage display always displays the "files" and "free" allocations in decimal bytes, and the "disk" space remaining is displayed as thousands of bytes remaining followed by the number of files on the disk in parenthesis (if a disk is currently mounted). Examples of "mem" operation without disk (files 23105 free 38344), example with disk mounted (files 23105 free 38344 disk 273K (14)).

<<mount>>

The "mount" program is a portal between the disk drive and memory. You insert a diskette into a drive and give the command (mount n), where "n" is the drive number. The "mount" program reads the structure of the disk and constructs a random access table named "disk-index". The "disk-index" stays in memory and is used by the "get" and "put" programs to access the disk. The physical disk can be removed from the drive, but must be present before any use of "get" or "put".

The disk storage is configured as 154 blocks of 2496 bytes. The simplicity of this design converts to reliability in operation and simpler recovery procedures.

The disk data on the disk is physically divided into a used file area and a free file zone. These two regions fill the entire disk surface; the file area is represented by the "disk-index" random access table, and the free zone is located by the next write pointer (the last entry in the "disk-index"). Automatic backup is provided by allowing previous copys of a file or file set to remain in the used file area, with the random access entry only for the latest version of a file in the used file area. The "purge" program recovers duplicate file space over the entire disk. The "forget" program can edit the "disk-index" to allow the "purge" operation to delete files from the disk. This disk organization makes it difficult to accidentally lose information from a disk. The "log" program compares an "index" of the disk contents with the actual "disk-index" contents and reports any missing or unlisted files.

<<put>>

The "put" program allows files or file sets to be transferred from memory to a mounted disk. The command format to transfer a file to disk is (put file-name). The command format to transfer a file set to disk is (put by file-name), the files in the file set are moved into a packed block before writing to disk. If the wrong disk is in the drive then the "?nope" edit will be taken. You can either insert the mounted disk or mount the disk in the drive. Disk operation is signaled by the ". . . done" message. The disk write will only be permitted if the disk is mounted and the structure on the disk is good. See "mount" for more information on disk operation.

<<save>>

The "save" file sends single files or file sets to the cassette tape drive. There are two command formats (save file-name N), and (save by file-name N). The "N" is an option to make multiple copies of the data on the tape. The single file is immediately sent to tape, but the (save by file-name N) format uses the named file to organize a file set and to send the entire file set to the tape. The multiple copy to tape option can be termiated by the "escape" key.

The hardware must be operated correctly (insert and remove cassettes, set the tape keys before operation and stop the tape unit after operation).

<<see>>

The "see" file allows you to examine the contents of text files using a static video page display. The "escape" or "return" key aborts a long listing, while any other key advances to the next static page of text display. The last page of display is padded with "#" characters.

The command format is (see file-name). If the named file is not a text file (it can be a link-code file) the "see" program chains to the "look" file.

<<verify>>

The "verify" file generates a digital signature of the file contents and compares it to the old signature in the file shell. If the signatures match, then a period is printed, else the file shell signature is updated and a null or square box is printed. The digital signatures will differ if even a single bit is altered in a 32k byte file, this is a powerfull quality control tool. The command format for a single file is (verify file-name).

The "verify" file also operates on file sets, testing each file in the set and displaying the names of files that had altered signatures. The command format is (verify by file-name).

<<dada: incremental interactive compiler.>>

The "Idiomatic Microcompiler" breaks complex operations out of the main program as special purpose tools. This organization makes modification simpler and prevents a single program from growing to occupy all of memory, filled with wonderfull obscure functions that are almost never used. The tools provided, to reconstruct the "Idiomatic Microcompiler", allow you to quickly build and test native code compilers for real or theoretical machinery. For example: a compiler for Intel's 8741 nanocomputer chip was conceived, executed, and tested over a single weekend.

<<bind>>

The "bind" file accepts a file set of link code files and a text order list and weaves the leaves into an executable format link code file that replaces the text order list. A leaf file that is not in link-code format will give an error message. The leaves are still in memory and unchanged.

The command format is (bind file-name), where "file-name" is the text order list for a set of link code files in memory. The "groak" file should be used on the order list (to insure an operable program).

<<data>>

The "data" file converts a source text file in a special format, to a link code file that contains a COBOL table nucleus, and bunches of link-code files that contain pointer data structures. There are two formats for COBOL data field data structures, and there is one format for the screen layout field data structure. The screen layout field format only generates a pointer data structure file, but the COBOL data field descriptors can also load literals into the table nucleus.

The syntax of the screen layout descriptor is "element-name R C S", where the "R" is the video row (top 0 to 23 bottom), and "C" is the video column (left 0 to 79 right), and "S" is the field size (1 ... 255).

The syntax of the group data field descriptor is "element-name leaf S", where "leaf" is a key word, and "S" is the field size (1 ... 255). The syntax of the real data field descriptor is "element-name S" or it is "element-name literal", where "S" is the field size (1 ... 255), and "literal" is a string enclosed by double quote marks. The double quote mark can be included in the literal by doubling double quote marks ("he said ""WOW""") becomes (he said "WOW").

<<groak>>

The "groak" file trys to arrange a file set of link code files into a program that works. It will tell you "* files missing *" when either the files are absent or still in the source text form (just need to be zapped). The program begins by finding all the leaves that either require no external symbol access, or refer to virtual instructions, these are the first level. Leaves that refer only to level one leaves or virtual instructions are level two. This process (Lambda calculus) keeps trying to make larger modules out of leaves and small modules. When the process is done, there will either be a single module that contains all the leaves or the program will display the list of leaves that are "* unresolved *". An unresolved leaf refers to some unresolved external symbol. If the pile of leaves is resolved, then the program order list is rearranged so that the highest level leaf is first then each level is added till all the leaves are listed. The program displays the number of levels it found and terminates.

The command format is "groak file-name (auto)", where "file-name" is the name of the text file containing the list of names of all the leaves of the program. The option "auto" selects "* Autogeneric System *", this only means that the leaves can not refer to the virtual instructions, or they will be left unresolved. This is nessary when you are creating a program that will stand alone and handle the hardware of your computing system.

<<look>>

The "look" file translates a link code file into a human readible form and displays static pages. The left edge of the screen displays the relative address as a hexadecimal word, then the string of code is displayed as hexadecimal bytes. Relative address pointers are displayed inside parenthesis, while symbolic address pointers are displayed inside bracketts. Program memory skip is displayed inside braces. Symbolic pointers to virtual instructions are decoded and the name is displayed inside the bracketts. The post indexed symbolic address format will have a bracketted symbol followed by a relative displacement in parenthesis.

The command format is (look file-name). The "see" file chains to the "look" file if the named file is marked as link-code by a zero or one in the first byte. There are three types of files in the "dada 83" operating environment; text, system link-code, and system binary. The text file consists of ASCII text strings preceeded by a total count byte. The end of text is marked by a count byte of 255. System link-code files have a zero as the first byte. The system link-code files are the source of the master overlay programs that instantly reconfigure the resources to perform specific tasks expertly. System binary files are marked by one in the first byte. System binary files are undefined and can have any arbitrary structure.

<<message>>

The "message" file allows you to create a link code file that contains one or more character count strings, entered from the console keyboard. This program allows text to be used in running programs for instructions, messages, or prompts.

The command format is (message file-name), where "file-name" is the name of the link code file that you are creating. The program then advances to the next line and allows you to enter the text (allowing backspace and cancel). When the release the record with a "return" key entry the next line is ready for entry. When you want to end entry (or for single line entry), press the "escape" key.

<<peek>>

The "peek" file allows you to examine memory. The command format is (peek address {alpha}), or (peek file-name {alpha}), where the braces indicate a program option. The program begins displaying rows of sixteen bytes at the address, the row address is displayed along the left margin. If the "alpha" option is selected, then the memory bytes are displayed as a single ASCII character, else the memory bytes are displayed in hexadecimal.

The return or escape keys end the listing, but any other key causes the display of the next slice of memory.

<<zap>>

The "zap" file translates source text files into link-code files. The "Idiomatic Microcompiler" allows high level language text and assembly language in the source text; it also supports a simple macro function. The high level language constructs are directly related to the virtual instructions, with parameters passed through the source text. The assembly language allows maximum performance to be obtained from the existing hardware. The vector function allows large extensions to be written simply in the source text (example; the source text "shr b" is translated to the machine code "get b: shr: put b"). The macro function allows you to insert file names in the source text, these names cause the insertion of a link-code file into the generated code file. This allows custom code to be made with the ease of standard functions.

The command format is (zap file-name). If the translation is perfect, a star will be displayed, else an error message will be displayed that tells the type of error and the line in the source file. Any key except escape or return will invoke the editor and allow you to correct errors in the source file. The translation process begins with a text file and ends with a link-code file.

Zapping a file does not make a running link-code file. Complex programs must first be Groaked, then Bound. Single file programs may be bound to create a system link-code file. If you want to tinker with a program, then create "a-" copys of the source text. You can alter the source text in the "a-" version, copy to the normal name then zap, groak, and bind to test the modification. This is an incremental interactive compilation process.

<<zaps>>

The "zaps" file allows you to zap a file set. Each file in the set that is in text source code will have the file name displayed and wait for an input from the console keyboard. The "escape" key aborts the program, and the "return" key causes the displayed file to remain in text source form (not zapped). Any other key causes the file to be zapped. The "zap" file will print a star if the translation was completed, but will display the line number and error type if any trouble develops. You have the option of entering the "edit" file and editing the bad text source file by pressing any key except "escape" or "return", either of these keys delete the edit option. This program can be used as a template for complex batch processing of files.

<<script: word processor>>

The "script" file set is an extended word processor system. The "print" program is well suited for simple word processing tasks, and can be improved to serve as a type-setting program. The "sort" program is a particular expression of the COBOL verb "SORT". Special report formats should be served by special purpose programs.

<<chop>>

The "chop" file digests text files for the "print" word processor. Records that begin with a period are not changed, and records that follow the ".c" code are not changed. The chopped text can be edited. The command format is "chop file-name".

The chopping process examines every character in a record to create individual tokens as single records. The alphabet, numbers, and punctuation characters are sticky and will stick to each other unless a blank or string of blanks divides the characters. All control codes can be used (example control g as bell, and imbedded tab characters).

<<clear>>

The "clear" file removes any flag bits that may be set in a text file. The "spell" program marks words that are not in the "dictionary" by setting flag bits, and the "hyphen" program sets flag bits to indicate possible hyphenation. The command format is (clear file-name), or (clear by file-name).

<<hits>>

The "hits" file has two ranges that search files for flag bits, usually these bits are set by the "spell" program. The command (hits by file-name) will dispay the names of any files in the file-set that contain any flag bits set. The command (hits file-name) will display the record numbers of any records in the selected file that have any flag bits set.

<<hyphen>>

The file "hyphen" allows you to alter a flag bit on any character in a text file. The flag bit indicates that a hyphen can precede the flagged character for the "spell" and "print" files. You can use this function to mark records for special processing in your custom program. The command format is "hyphen file-name". The "hyphen" program contains the special instructions to edit individual characters in a text file with a specialized full screen editor.

<<print>>

The "print" file is a word processor program that uses imbedded format commands and supports text recursion. The text recursion allows documents to be stored in memory as a file set, with the printing order determined by one of the text files. The command format is (print file-name {out}), where the text file is the first or control file. The option "out" selects a printer on a parallel port, but the default selects the 80 column video display. The "archive" contains the Gemini-10X print driver. The driver supports six type sizes, two type fonts, double strike, super and sub scripts, underline, and emphasized type (correspondance quality type).

The "imbedded format" commands are called "dot codes", because they are formed by starting a string with a period (or dot). Three single character dot codes are used to format the text; ".c" center the next record, ".i" indent and begin paragraph, and ".p" skip to the start of the next page. A text file is included in the formatted output by the inclusion of the file-name preceded by a period (or dot) in the source text. Sixty-four levels of text recursion are supported by the word processor. The documentation source files are marked by the "s-" prefix to the file name. If an illegal file is encountered, an error message is displayed and the word processor terminates.

The "print" program allows you to put a title heading on each page of a print-out and an optional page number at the bottom of each page. Either of these options may be used alone. The title heading is printed if a file "page-header" exists, printing the first text line on the top of each page. The page number is printed if the file "page-footer" exists, printing the last text line on the bottom of each page. The page number is incremented after each use (example; "page Number 29.99", becomes "page Number 30.00").

The dot codes recognized by the printer driver allow full control of the printing style, size, and margins. All of the printer dot codes operate by toggling a feature on then off. The code that selects a feature, also turns that feature off.

(.a) [alternate]: Select either single or double spacing for lines on the printout. Material that will be corrected should be double spaced to allow editing remarks to be written on the copy. Reference information can be single spaced, to conserve space.

(.b) [bottom]: Sets the margin at the bottom of each page. See "margin" for examples.

(.c) [center]: Center the next record. The record will be centered between the current left and right page margins.

(.d) [dark]: Make the text dark by using double strike.

(.e) [emphasized]: Use a detailed matrix (18×18) to form characters in type size three or six.

(.f) [fancy]: Select italic character set (normal is roman set).

(.i) [indent]: Indent and begin paragraph.

(.j) [subscript]: Select subscript option in type size one and two. Remember that the "j" is below the line for "subscript".

(.k) [superscript]: Select superscript option in type size one and two. Remember that the "k" reaches for the top of the line, like the "superscript".

(.l) [left]: Set the left margin. See "margin" for example.

[margin]: The top, bottom, left, and right margins are set by a dot command containing the distance in inches and sixteenths of an inch. (.t 2 4) Sets the top margin two and four sixteenths of an inch. (.b 7 15) Sets the bottom margin to the maximum distance that can be entered with any margin code, seven inches and fifteen sixteenths of an inch. (.l 3 8) Sets the left margin at three and one half inches. (.r 4) Sets the right margin at four inches, you must include the inches in a margin code, even for zero inches, but you do not have to include any sixteenths.

(.o) [zero-slash]: Select the use of slashed zeroes, to prevent confusion between the letter "OH" and the number "zero".

(.p) [page]: Advance to the next print page.

(.r) [right]: Set the right margin. See "margin" for example.

(.s) [single-sheet]: Select the single-sheet mode. This mode allows you to use single sheets of paper to print out multi-page listings. The computer will wait for you to service the printer, and resume printing if you press any key except "escape" or "return". Pressing either the "escape" or the "return" key will abort the printout.

(.t) [top]: Set the top margin. See "margin" for an example.

(.u) [underline]: Toggle the underline option. If the underline remains on, then even the blanks between words will be underlined.

(.z) [type-size]: Select one of the six type sizes from one to six. The actual number of characters per inch from size one to size six are: 17, 12, 10, 8.5, 6, and 5 characters per inch.

<<size>>

The "size" file has two ranges that search files for the number of lines in a file and the maximum record size in the file. The command (size by file-name) will display the names of the files in the file-set and report the number of lines in a file and the maximum record size in the file. The command (size file-name) will report the number of lines in a file and the maximum record size in the file. Both report modes wait for a key to be pressed before advancing, the return or escape keys cause the file-set report to terminate.

<<sort>>

The "sort" command will sort the records in a single file, or a file-set; both operations create a file of sorted records with the same file-name. The command (sort file-name) sorts records from a single file. The command (sort by file-name) sorts the records from a file-set. This command is part of the COBOL nucleus.

The sorted file will contain each different record only once, preventing duplicate records in the sorted file. You simply (rename file-name new-name) to change the name of the sorted record file. When the sorted record file is renamed or gloped the starting file-name is present unchanged.

<<spell>>

The "spell" file operates on single files or on file-sets. A "dictionary" file must be present for the "spell" file to operate. The command (spell file-name) uses random access into the "dictionary" file to check the spelling of records in the selected file. Records in the selected file that are not listed in the "dictionary" file are flagged, while records that are listed in the "dictionary" file are overwritten with the "dictionary" entry (allowing hyphenation in the "dictionary" file to be transfered to the records of the selected file). The command (spell by file-name) operates in a similar way on all the files in the file-set.

<<utility: disk and tape programs>>

The "utility" file set contains special programs that operate hardware features and usually interact directly with system files. The naked software drivers for commonly used devices are also stored in this file set.

<<apend>>

The "apend" file apends a binary image copy from the source disk, onto the files existing on the destination disk. Apending a disk is not affected in any way by the data or control structure on either disk, but the files present on the destination disk will be replaced by files with the same name on the source disk. The program begins by describing the drive assignment and asking the operator to respond, before the process begins. The data is moved in large chunks, using all free memory. Power failure will spoil the destination disk, but will not harm the source disk (the source disk is used as a read only data source).

<<clone>>

The "clone" file reads a set of files from tape into a temporary block, then writes the temporary block out file by file and repeating until the escape key is pressed. The program prompts you for the file-name to load from tape, then operates similar to the "load" file. The maximum memory address used is displayed after the named file is loaded. Loading continues until you terminate loading by typing "write" in response to the file-name prompt. The program then writes the files to tape in an endless loop. You must operate the tape unit and provide the correct tapes.

The advantage of the "clone" file is that file sets can be handled as single units, allowing easier and faster cassette tape system generation. Each file that is loaded is verified, and file-sets are totally verified. Note: the "clone" file operates on the SOL-20 computer hardware only.

<<com>>

The "com" file allows files or file sets to be transferred between microcomputer systems using 3-wire cable between two RS-232-C serial interfaces operating full duplex (9600 bits per second, eight bits, odd parity). The hardware and null modem cable is required to be operational. There are three modes of the "com" program; (1) listen, (2) send a file, and (3) send a file set.

The command format for the (1) listen mode is (com). You use this command when you know that the other system has been triggered to send, and you are ready to listen. When each file is received, a star will be displayed, and when the last file is received, the program will terminate.

The command format for the (2) send file mode is (com file-name). You use this command when you are ready to send a single file. Actual transmission waits on the distant end sending a "ready to receive" signal. A star will be displayed when the file is sent and the program will terminate.

The command format for the (3) send a file set is (com by file-name). You use this command when you are ready to send a file set (the named file must contain a text list of the files to send). Transmission of each file waits for a "ready to receive" signal from the distant station. A star will be displayed as each file is sent and the program will terminate when all the files are sent.

<<disk-move>>

The "disk-move" file allows two microcomputer systems to transfer the contents of a disk via a duplex serial channel (9600 baud, 8 bits odd parity). The program is menu operated and uses a handshake protocol to transfer data blocks without loss. Normal use would be to transfer the archive library to a microcomputer that has just received a new kernal. The archive library programs often will work as is, but some programs are hardware specific and must be tuned for the new hardware.

<>

The "duplicate" file creates a binary image copy from a disk to a formatted disk. The duplication of a disk is not affected in any way by the data or control structure on the source disk. The program begins by describing the drive assignment and asking the operator to respond, before the duplication process begins. The data is moved in large chunks, using all free memory. Power failure during duplication will spoil the duplicate disk, but will not harm the source disk (the source disk is used as a read only data source).

<<forget>>

The "forget" file acts directly on the "disk-index" file in memory. The "disk-index" file is used for all disk transactions. The simple command format is (forget). The disk must retain five files (cyber, dada, script, shar, and utility). If the (forget) command is followed by a (purge), then only the core operating files are retained on the disk, and the space from deleted files is recovered and packed.

The "forget" file also has two directed modes of operation: (forget file-name), and (forget by file-name), both modes only operate on the "disk-index" file in memory. If a "purge" is performed, only the files listed in the "disk-index" file in memory are retained. All other files are deleted and the space recovered and compressed.

<<format>>

The "format" file allows you to initialize a new disk and assign the volume number of the disk. The command is (format n), where n is the disk drive selected (0 ... 3). You will receive a prompt to "select volume number", then you can select a volume number from zero to 200.

The "format" program begins writing entire tracks across the disk. You can hear the track to track click about once a second until the 77 tracks are formatted. The program then reads each block from the new tracks and displays the block number of any blocks that are bad. If all of the blocks are OK, then the disk will be initialized with zero files and a star will be displayed. If a disk has one or more bad blocks, then put it aside until all other disks are formatted. Try to format a bad disk a second time, then if it still is bad return it to the manufacturer for a replacement disk. Do not use a disk that fails to format.

<<hard-copy>>

The "hard-copy" source file installs a patch into the video display driver. When the "hard-copy" program executes, every character that is displayed on the video console is echoed to the parallel printer. The patch can be removed by writing E5 to the two addresses displayed by the patching program. The hardware handshake will slow down the video display to the speed of the printer.

<<new-log>>

The "new-log" program takes a list of file-names in the "index" file, and looks up the file-names in the "disk-index". Names that are not present in the "disk-index" are deleted. Names of active files have the file size apended.

<<printer-demo>>

The "printer-demo" program causes a Gemini-10 printer to print a sample of most font sizes, and scripting.

<<purge>>

The "purge" file removes all duplicate copys of files on the mounted disk, recovers and packs the space from deleted files. The "purge" file operates in two phases: each file is moved to a packed block on the disk (indicated by a parenthesis pair), then an equals sign is displayed and the packed block is moved to overwrite the file-zone on the disk (all of available memory is used to move large chunks of data quickly, the left parenthesis is displayed for each move to memory, and the right parenthesis is displayed for each move to disk). Until the equals sign is displayed, you can eject the diskette without losing any data. The packed block of data can be used to recover from a power failure during the packed block move. Recovery is always possible, but back-up procedures should make recovery unnessary.

<<spec>>

The "spec" program displays a frequency domain histogram of an audio frequency signal. The input signal is converted to a square wave by slicing the input signal at the zero crossing. This procedure removes direct amplitude modulation while preserving frequency and phase information. The program measures frequency indirectly by sorting the measured pulse width of the input and counting each sorted pulse into an array. When any count value of the pulse array reaches the maximum count, then the array is displayed as a histogram on the video screen. The vertical axis denotes counts accumulated, and the horizontal axis is calibrated as pulse width multiples of six point four microseconds. For example the pulse width at horizontal location ten is sixty-four microseconds.

The information in the sorted pulse count array is further evaluated and displayed on the line below the horizontal calibration strip. For each isolated group of measurements (the typical bell shaped curve) a fraction is displayed that gives the peak of a narrow range accurate to four hundred nanoseconds. To find the exact peak pulse width, multiply the fraction by six point four. The answer is in microseconds. The cyclic period of a waveform is twice the period of the half-cycle measured as the pulse width.

<<spore>>

The "spore" program writes the "cyber" program to EPROM with an injector that installs the "cyber" virtual computer. The "cyber" program loads the rest of the "shar" file set and allocates memory. The "spore" program writes EPROMs in bank one and bank two (volatile memory is bank zero), segmenting the "cyber" program across several 2732A chips. The "spore" file keeps track of the writing process and requires a handshake key press to allow the operator to remove and install EPROMs in the writing fixture. The offset address of the "shar" file is displayed after the "cyber" file is written, and again after the "shar" file set is done.

The "cyber" program tests for the presence of a "shar" file set and preserves any existing files. The power-up reset initializes the "shar" file set that contains the "dada" file set. This dual file start allows troubleshooting and diagnosis even with the Disk drives and Tape interface dead or missing. Special purpose file sets can be used to configure hardware to a specific task (for example, word processing or as a dedicated industrial process controller).

<<view>>

The "view" file allows you to see and modify data that is stored on a disk. The program operates as a full screen editor with the entry and cursor motion controlled by different keys to simplify data alteration. The "escape" key causes the program to terminate. The control key and the four motion keys at the left side of the keyboard (A, S, W, and Z). select the direction of motion. The control (@) key (mode select) selects an overlay for the direction keys. The normal mode for the direction keys is to move the cursor around the screen, trapped by the screen boundaries. If the mode select is activated, then the direction keys are overlaid with a higher level of command where control A and S cause the disk block number to rewind or advance; also the control W and Z keys move the screen along the disk block.

These keys are augmented by a power move option. The power move option is selected by entering control 3 to 9 before the mode or direction keystrokes. In the normal screen mode, the power option causes the motion directed to be carried out three times the value entered. For example, the control sequence (control 5, control @, control S) causes the disk block number to be advanced fifteen blocks.

The control K (clear) and control L (load) keys aid in editing data on a disk. The clear key resets the screen to the beginning of the disk block but retains the altered data. The load key causes the disk to refresh the block buffer and restore any altered data. Both keys are usefull to reduce the number of errors while entering data directly to the disk.

There are two viewing masks for the screen (hexadecimal and text). The hexadecimal format allows you to alter nibbles, and the alpha mask allows you to alter text characters. The control T key selects the text mask, and the control X key selects the hexadecimal screen mask. The screen is protected from alteration except when the cursor is over either nibble of a hexadecimal byte or over a text character. The hexidecimal mask accepts the characters (0 ... 9, A ... F, and a ... f), all other characters generate a zero nibble, but are echoed as entered. With the alpha mask, what you see is what you poke.

The two keyboards that I've tried have had different ways of processing shift and control keys. One keyboard only requires control but the other requires control and shift to get the control numbers. The more difficult keyboard will not give null for any combination of control and shift for the "@" required to shift the command mode, use control zero if control "@" will not work on a keyboard.

Asteroid Mining Ltd. Research & Development Operating Environment <<Hardware overlay Kernel>> Catalog and documentation Copyright 1983 by Dannie Earl Davis Distributed by Asteroid Mining Ltd.

The operating environment kernel is a virtual computer that executes the native machine code and also executes virtual instructions that can be of any desired complexity (even application programs). The virtual instruction set is described as seven procedural sets that enhance the operation of the microcomputer system: (1) system, (2) files, (3) string, (4) calculate, (5) display, (6) keyboard, and (7) disk). All of these functions are important and mutually dependent, but are examined as isolated programs for your study.

<<calculate>>

The "calculate" set of virtual instructions operate on two's-complement words and ten's-complement strings. The two's-complement word operators (divide, multiply, sqrt, and random) are for elemental uses in programs (accessing arrays, system numeric calculations, and statistics). The ten's-complement strings are the "comp-3" internal form of numeric strings, and the virtual instructions allow programs to add, subtract, multiply, and divide using strings of different sizes (from one byte to 255 bytes).

<<disk>>

The "disk" virtual instructions operate the disk hardware as blocks of memory. The fixed block size of data on a disk allows the highest data usage on the disk (93%) with the fastest actual read and write times possible (average read one track in 1.5 revolutions, worst case write one track in two revolutions). The "disk" module uses hidden compilation, this allows new disk driving software to be easily installed.

<<display>>

The "display" virtual instructions send data to the bank switched display memory. The video display has two operating modes: (1) infinite scrolling, and (2) static video pages. The infinite scrolling mode uses a cursor to sequentially place data on the video display. The static video page mode allows random access to the display.

<<files>>

The "files" are owned by a dynamic memory manager that uses content addressable access. My experience indicates that seldom will you be using more than two hundred files, but you can use thousands of files if needed. When programs are changing the size of files, the position of individual files change in memory; but the manager always is in control and program access is simple. Each file has a rigid structure that is used by the memory manager for access, and allows recovery from some file destruction. The file structure allows a digital signature of the file contents to be used to detect even a single bit change in a 32K file. The virtual instructions used by programs to operate the files are open, close, and find. The dynamic file que resides in volatile memory.

<<keyboard>>

The "keyboard" virtual instructions get data or interpret data from the keyboard. Every ASCII keyboard is different in many ways, the "keyboard" virtual instructions allow you to make all keyboards equal. The normal get a keystroke is supported, and several exotic key to screen entry routines that allow you to enter data into a static video field (like filling out forms).

<<string>>

There are two string virtual instructions (move and justify). Both of these operations switch the video bank on to allow strings to move to or from the video screen memory.

<<system>>

The "system" set of virtual instructions give every application program access to all of the resources (programs, files, memory, perphirals, and system utilities) existing in your microcomputer system. The functions that are unique to the "system" are the tasker (program chaining & default command), parser and parameter passing mechanism, and ultimate file dynamic values.

The tasker is transparent during operation, instantly directing the activities. The default task is the "command" program, but the tasker also can be directed to "chain" from program to program.

The parser is a finite state machine that transforms a record containing ASCII characters into a stack of evaluated tokens. The token stack is available to any program. The theory of the parser is a little bit sticky (transfinite mapping in a vector space of unbound dimensions), but it works well.

The ultimate file dynamic values are available to all programs, but should be read only and not twiddled. You are given the power to change the operaing system from the console while the system is running, however random changes will almost always cause chaos.

<<calculate>>

The "calculate" set of virtual instructions operate on two's-complement words and ten's-complement strings. The two's-complement word operators (divide, multiply, sqrt, and random) are for elemental uses in programs (accessing arrays, system numeric calculations, and statistics). The ten's-complement strings are the "comp-3" internal form of numeric strings, and the virtual instructions allow programs to add, subtract, multiply, and divide using strings of different sizes (from one byte to 255 bytes).

<<align>>

The "align" virtual instruction moves a source ten's-complement string to a destination ten's-complement string. The move is right justified and the sign byte is extended if any filler is needed in the destination string.

<<comp-3>>

The "comp-3" virtual instruction changes a numeric string into a ten's-complement string. This function prepares the string for the string calculation functions.

<<divide>>

The "divide" virtual instruction performs a signed binary division dividing the de register pair by the hl register pair. The quotient is returned in the hl register pair and the remainder is returned in the de register pair. When you need to calculate addresses, you will need an unsigned divide.

<<double>>

The "double" virtual instruction takes a ten's-complement string and multiplys by two. This function is used in the string multiply and can be used to convert a binary integer to a ten's-complement string.

<<half>>

The "half" virtual instruction takes a ten's-complement string and divides by two. This function is used in string division and converting a binary fraction to a ten's-complement string.

<<multiply>>

The "multiply" virtual instruction performs signed binary multiplication on the contents of the hl and de register pairs. The product is returned in the hl register pair. If the product overflows the hl register pair, then hl will be set to zero and the carry flag will be set. When you need to calculate addresses, you will need an unsigned multiply.

<<neg>>

The "neg" virtual instruction accepts a ten's-complement string and negates the string. This function is reversable and can be used without changing the absolute value of the string.

<<numeric>>

The "numeric" virtual instruction changes a ten's-complement string into a numeric or display string. This function converts the results of calculation into the display form.

<<random>>

The "random" virtual instruction begins with a binary word in the hl register pair, and then generates a random value between zero and the input word, less one. The value is returned in the hl register pair. This function is usefull in simulation and modeling.

<<sqrt>>

The "sqrt" virtual instruction generates the square root of an unsigned binary word in the hl register pair and returns the value in the A register. This function can be usefull in graphic calculations and can solve right triangle problems.

<<sum>>

The "sum" virtual instruction performs triple field algebraic addition. The only requirement is that the destination field size must not be smaller than either of the two source fields, that causes trunctuation error. The source code format is (sum alpha with beta put gamma), where alpha, beta, and gamma are element names of numeric fields. If both inputs of the "sum" virtual instruction are of the same sign, then you can use the double field version (sum alpha into beta), the beta numeric field receives the sum of alpha and beta.

<<display>>

The "display" virtual instructions send data to the bank switched display memory. The video display has two operating modes: (1) infinite scrolling, and (2) static video pages. The infinite scrolling mode uses a cursor to sequentially place data on the video display. The static video page mode allows random access to the display.

<<bihex>>

The "bihex" module begins with a binary value in the A register, this value is sent to the display at the video cursor location as two hexadecimal characters.

<<decot>>

The "decot" module begins with an unsigned binary word in the hl register pair, and displays the decimal value at the video cursor location on the video screen. Leading zeroes are not displayed, causing a variable size string to be displayed.

<<line>>

The "line" function is a program leaf that erases the video cursor and moves the video cursor to the start of the next display line. The scroll is advanced and the new line is filled with blanks. All registers are preserved.

<<menu>>

The "menu" module begins with a pointer in the hl register pair, that points to a data structure containing character count text records and a list of data words. The "menu" function clears the video screen, then centers the text records and adds selection numbers. Any key input outside the selection range is ignored, but a selection inside the range causes the indexed data word to be returned in the hl register pair.

<<output>>

The "output" function is a program leaf that displays the ASCII character from the A register at the video cursor location, while preserving all registers.

<<plex>>

The "plex" module selects one of an odd number of text messages to display at the cursor location. This function is usefull to give different versions of instruction or error messages, instead of simply seeing the same message over and over. The (#) character in a message string causes the display to advance to the next line, allowing multiline messages. The (%) character in a message string inserts a string stored at page zero (usually the users' name or log-on word). There must be an odd number of messages in the data block pointed by the -hl- register pair. Five or more messages have about an equal chance of selection, but with three messages the second message has twice the chance of selection of either of the other messages.

<<put-record>>

The "put-record" module begins with a pointer in -hl- register pair, that points to the count byte of a character count record. The character count record is sent to the video display beginning at the location of the video cursor. Strings with a count byte of zero or one (both illegal values) must be prevented from existing in memory.

<<screen>>

The "screen" module fills the video memory with blanks and clears the scroll to zero. This is the page mode for the video display.

<<files>>

The "files" are owned by a dynamic memory manager that uses content addressable access. My experience indicates that seldom will you be using more than two hundred files, but you can use thousands of files if needed. When programs are changing the size of files, the position of individual files change in memory; but the manager always is in control and program access is simple. Each file has a rigid structure that is used by the memory manager for access, and allows recovery from some file destruction. The file structure allows a digital signature of the file contents to be used to detect even a single bit change in a 32k file. The virtual instructions used by programs to operate the files are open, close, and find. The dynamic file que resides in volatile memory.

<<close>>

The "close" module begins with a compressed symbol in the hl register pair. The named file is removed from the dynamic file que and the deleted memory is recovered.

<<end-of-files>>

The "end-of-files" module returns a pointer to the end of the dynamic file que in the hl register pair. This is the location to create a file. The null data word that defines the end of the dynamic file que must be preserved. Keep in mind, that the "open" function will cause the files in the dynamic file que to move around and can change the end of files location.

<<find>>

The "find" module begins with a compressed symbol in the hl register pair. If the file is not in the dynamic file que, then an exit with the carry flag set is performed, else a normal exit is taken with the hl pair containing a pointer to the start of the file, the de register pair containing the size of the file, and the bc register pair containing the compressed symbol name of the file.

<<flock>>

The "flock" module begins with a compressed symbol in the hl register pair. If an attempt to "find" the file fails, then an exit with carry flag set is performed, else the digital signature of the file is generated and compared to the old signature in the file. If the signatures match then a normal exit is taken. If the signatures differ, then the new signature is written into the file and the carry flag is set before exit.

<<open>>

The "open" module begins with a compressed symbol in the hl register pair. If the named filed exists in the dynamic file que, then it is moved to the top of the dynamic file que where its size can change, else an empty file is created at the top of the dynamic file que. The registers are loaded the same as the "find" function before exit.

<<keyboard>>

The "keyboard" virtual instructions get data or interpret data from the keyboard. Every ASCII keyboard is different in many ways, the "keyboard" virtual instructions allow you to make all keyboards equal. The normal get a keystroke is supported, and several exotic key to screen entry routines that allow you to enter data into a static video field (like filling out forms).

<<get-left>>

The "get-left" module is used with a video mapped string field for left justified echoplex entry. The control keys cause the field to be cleared. The routine exits for an escape key, or when the field is full.

<<get-record>>

The "get-record" module requires a memory pointer in the hl register pair. This function provides echoplex keyboard character entry into a character count record. Two control keys are supported (1) backspace, and (2) cancell. The backspace key causes the echo display and the memory buffer to backspace. The cancel key causes the echo display and memory to be restored to empty condition. The routine has two exits (1) return, and (2) escape.

<<get-right>>

The "get-right" module is used with a video mapped string field for right justified echoplex entry. The control keys (backspace or cancell) clears the field and the escape keys (return or escape) ends entry.

<<input>>

The "input" module is a program leaf that fetches a character from the console keyboard into the A register, while preserving all other registers.

<<test-for-control>>

The "test-for-control" module is a program leaf that can recognize two control keys (backspace and cancell). If the value in the A register matches either character, then the zero flag will be set, additionally the cancel value sets the carry flag.

<<test-for-escape>>

"The test-for-escape" module is a program leaf that can recognize two control characters (return and escape). If the value in the A register matches either character, then the zero flag will be set, additionally the escape value sets the carry flag.

<<string>>

There are two string virtual instructions (move and justify). Both of these operations switch the video bank on to allow strings to move to or from the video screen memory.

<<justify>>

The "justify" module moves a "string" from a source field to a destination field. If the destination field is smaller than the source field, then the destination string is trunctuated and right justified. If the destination field is larger than the source field, then the destination string is right justified and padded with blanks. The source format is (justify alpha to beta), where alpha and beta are the labels of defined strings.

<<move>>

The "move" module moves a "string" from a source field to a destination field. If the destination field is smaller than the source field, then the destination string is trunctuated and left justified. If the destination field is larger than the source field, then the destination string is left justified and padded with blanks. The source format is (move alpha to beta), where alpha and beta are the labels of defined strings.

<<system>>

The "system" set of virtual instructions give every application program access to all of the resources (programs, files, memory, perphirals, and system utilities) existing in your microcomputer system. The functions that are unique to the "system" are the tasker (program chaining & default command), parser and parameter passing mechanism, and ultimate file dynamic values.

The tasker is transparent during operation, instantly directing the activities. The default task is the "command" program, but the tasker also can be directed to "chain" from program to program.

The parser is a finite state machine that transforms a record containing ASCII characters into a stack of evaluated tokens. The token stack is available to any program. The theory of the parser is a little bit sticky (transfinite mapping in a vector space of unbound dimensions), but it works well.

The ultimate file dynamic values are available to all programs, but should be read only and not twiddled. You are given the power to change the operating system from the console while the system is running, however random changes will almost always cause chaos.

<<chain>>

The "chain" program begins with a compressed symbol token in the hl register pair. The symbol is used to "find" the named file. If there is no file by that name, control passes through the tasker to the default file "command". The file must be valid link code for the "linker" to assemble an absolute machine code run program in the overlay area and transfer execution to the new program. If there is an error in the link code file, then the message "serious linkage error" will be displayed and control will be transfered to the "command" program.

<<dada>>

This is the main tasker entrance that picks the default program "command". The "command" program allows you to select any program to run and to pass parameters by simple console entry. All programs can transfer to the tasker at any time.

The "look" program will translate this reference into "dada-83", where 1983 is the year this operating environment was copyrighted.

<<global-look>>

The "global-look" program is a content addressable memory that knows where every virtual instruction is in memory and how to write it's name. An example of use is in the "look" program in the operating environment files.

<<mbs>>

The "mbs" module is a "move block sequential incrementing" virtual instruction. The source pointer is the hl pair, the destination pointer is the de pair, and the block move size is the bc register pair. The first move happens before the pointers are incremented.

<<mbsd>>

The "mbsd" module is the "move block sequential decrementing" virtual instruction. The hl register pair points to the source, the de pair points to the destination, and the bc register pair contains the block move size. The pointers are decremented before the first move happens.

<<memtop>>

This is a reference to the data word that points to the base of the program overlay area. An example of use is in the "mem" program.

<<param>>

The parameter stack pointer and type information are returned by this virtual instruction. The hl register pair contains the pointer to the first element of the stack, each element is two bytes and the pointer is incremented (low byte: inx: high byte: inx). The number of tokens in the stack is in the A register. The B register contains the bit mapped type information (zero is numeric, one is symbol) with the first stack element written as the least significant bit in the B register.

<<parse-record>>

The record parser begins with a memory pointer in the hl register pair that points to the count byte of a character count record. If the record is an end of file byte (255), then an exit with the carry flag set is performed; else the record is parsed into tokens and stacked.

The tokens are stored in a stack and the type information is preserved. Symbols are compressed into a digital signature of the binary bit pattern. Decimal, hexadecimal, and signed numbers that fit into a 16 bit word are stacked, with 16 bit compressed symbols. The type information allows each token to be encoded as 17 bits in a stack element.

<<root>>

This is a reference to the data word pointing to the beginning of the dynamic file que. An example of use is in "mem" program.

<<demo>>

The "demo" program is designed to introduce you to some of the features of <<dada 83>>. This program is a menu driven program with two slave programs (1) percent multiply, and (2) fast screen access.

The "percent multiply" slave program uses a static formatted video screen and right justified input fields. You enter a dollar amount (34.78) and a two digit percent, and the product is displayed. If zero percent is entered, then a return to the main menu is executed. The return or escape key will cause a return to the main menu when the product is displayed, but any other key allows you to enter another amount and percent. The amount field is locked to require a decimal followed by two digits (cents) before proceeding.

The "fast screen access" simulates a scientific program by initializing the static video screen with twenty-four rows of thirteen six-digit number fields. Number fields are selected by a random number generator and incremented. This slave program has no exit, requiring a machine reset to resume normal operation.

The "demo" program is loaded from disk and run by two command strings. The command string (get demo) will get the "demo" program from the mounted "archive" disk. The second command string is (demo), this causes the program "demo" to take over the computer. You will see the menu with selection numbers to the left of each option. Enter the number of your selection.

If you want to compile "demo", then (get a-demo), and (get dada). The command string (zaps a-demo) will display each file name and wait for you to press a key (see help-5: s-zaps). The file "cobol-fields" will not be zapped, because it is in a different format. When all the files are zapped except "cobol-fields", then copy the file "cobol-fields" into the "a-demo" file (see help-4: s-edit). The command string (data cobol-fields) creates a COBOL table for the "demo" program to use. The command string (groak a-demo) should tell you the number of levels in "a-demo" and arrange the text list for the bind verb. Copy the "a-demo" file to "demo" after correct groak operation (copy a-demo demo), then (bind demo). An option is to (verify demo) before writing demo to disk. The "help" files (help-3 to help-7) contain documentation and explanation on every command verb in <<dada 83>>. The "help-cyber" set of files contains information about the operation of the virtual computer.

<<bind>>

The "bind" file accepts a file set of link code files and a text order list and weaves the leaves into an executable format link code file that replaces the text order list. A leaf file that is not in link-code format will give an error message. The leaves are still in memory and unchanged.

The command format is (bind file-name), where "file-name" is the text order list for a set of link code files in memory. The "groak" file should be used on the order list (to insure an operable program).

<<data>>

The "data" file converts a source text file in a special format, to a link code file that contains a COBOL table nucleus, and bunches of link-code files that contain pointer data structures. There are two formats for COBOL data field data structures, and there is one format for the screen layout field data structure. The screen layout field format only generates a pointer data structure file, but the COBOL data field descriptors can also load literals into the table nucleus.

The syntax of the screen layout descriptor is "element-name R C S", where the "R" is the video row (top 0 to 23 bottom), and "C" is the video column (left 0 to 79 right), and "S" is the field size (1 ... 255).

The syntax of the group data field descriptor is "element-name leaf S", where "leaf" is a key word, and "S" is the field size (1 ... 255). The syntax of the real data field descriptor is "element-name S" or it is "element-name literal", where "S" is the field size (1 ... 255), and "literal" is a string enclosed by double quote marks. The double quote mark can be included in the literal by doubling double quote marks ("he said ""WOW""") becomes (he said "WOW").

<<edit>>

The "edit" file allows you to create or modify text files. The display format is similar to "see" except all lines of text are numbered on the left, and the bottom line is the command echo line. The prompt of the command echo line lists all the valid commands (see, build, kill, copy). If you give an invalid command, the edit program terminates.

The "see" command must include a line number to display the static page of the text file (see 71). If you ask for a line past the end of file, then the display will begin at the end of file record.

The "build" command must include a line number to insert the text (build 37). You will be allowed to enter records (with backspace and cancell) using the return key when each record is done. When you are through entering records, the escape key terminates the text entry and the text is inserted into the file. The text buffer is set at two thousand characters, so it is unwise to enter more than a screen full of text at one gulp.

The "kill" command erases the record at the line number entered with the command (kill 53). In order to erase a group of records, enter the line number of the first record to erase then the line number of the last record to erase with the command (kill 97 105).

The "copy" command allows you to insert the contents of a text file into the file you are editing. This command requires a line number and a file name (copy 123 paragraph).

Any text file that is edited has the digital signature in the file shell set to null, this marks edited files as being altered. You should inspect the file contents and be satisfied that the file contents are correct before you "verify" the text file.

<<get>>

The "get" program transfers data from a mounted disk into memory. The command format is (get file-name). If the named file is not on the mounted disk, then "nope" will be displayed and the program terminates. If no disk has been mounted, then the "nope" exit will also be taken. If the wrong disk is in the drive the "?nope" exit will be taken, indicating that you need to either insert the mounted disk, or you must mount the disk in the drive. Correct transfer is signaled by a " ... done" message. Hard errors are reported. See "mount" for more information on disk operation.

<<groak>>

The "groak" file trys to arrange a file set of link code files into a program that works. It will tell you "* files missing *" when either the files are absent or still in the source text form (just need to be zapped). The program begins by finding all the leaves that either require no external symbol access, or refer to virtual instructions, these are the first level. Leaves that refer only to level one leaves or virtual instructions are level two. This process (Lambda calculus) keeps trying to make larger modules out of leaves and small modules. When the process is done, there will either be a single module that contains all the leaves or the program will display the list of leaves that are "* unresolved *". An unresolved leaf refers to some unresolved external symbol. If the pile of leaves is resolved, then the program order list is rearranged so that the highest level leaf is first then each level is added till all the leaves are listed. The program displays the number of levels it found and terminates.

The command format is "groak file-name (auto)", where "file-name" is the name of the text file containing the list of names of all the leaves of the program. The option "auto" selects "* Autogeneric System *", this only means that the leaves can not refer to the virtual instructions, or they will be left unresolved. This is necessary when you are creating a program that will stand alone and handle the hardware of your computing system.

<<verify>>

The "verify" file generates a digital signature of the file contents and compares it to the old signature in the file shell. If the signatures match, then a period is printed, else the file shell signature is updated and a null or square box is printed. The digital signatures will differ if even a single bit is altered in a 32k byte file, this is a powerfull quality control tool. The command format for a single file is (verify file-name).

The "verify" file also operates on file sets, testing each file in the set and displaying the names of files that had altered signatures. The command format is (verify by file-name).

<<zap>>

The "zap" file translates source text files into link-code files. The "Idiomatic Microcompiler" allows high level language text and assembly language in the source text; it also supports a simple macro function. The high level language constructs are directly related to the virtual; instructions, with parameters passed through the source text. The assembly language allows maximum performance to be obtained from the existing hardware. The vector function allows large extensions to be written simply in the source text (example; the source text "shr b" is translated to the machine code "get b: shr: put b"). The macro function allows you to insert file names in the source text, these names cause the insertion of a link-code file into the generated code file. This allows custom code to be made with the ease of standard functions.

The command format is (zap file-name). If the translation is perfect, a star will be displayed, else an error message will be displayed that tells the type of error and the line in the source file. Any key except escape or return will invoke the editor and allow you to correct errors in the source file. The translation process begins with a text file and ends with a link-code file.

Zapping a file does not make a running link-code file. Complex programs must first be Groaked, then Bound. Single file programs may be bound to create a system link-code file. If you want to tinker with a program, then create "a-" copys of the source text. You can alter the source text in the "a-" version, copy to the normal name then zap, groak, and bind to test the modification. This is an incremental interactive compilation process.

<<zaps>>

The "zaps" file allows you to zap a file set. Each file in the set that is in text source code will have the file name displayed and wait for an input from the console keyboard. The "escape" key aborts the program, and the "return" key causes the displayed file to remain in text source form (not zapped). Any other key causes the file to be zapped. The "zap" file will print a star if the translation was completed, but will display the line number and error type if any trouble develops. You have the option of entering the "edit" file and editing the bad text source file by pressing any key except "escape" or "return", either of these keys delete the edit option. This program can be used as a template for complex batch processing of files.

What is claimed is:

1. In self-organising planning and manufacturing systems, the linguistic/gnostic kerning (knowledge and understanding compression by symbol factoring and naming) ability to convert thoughts into things and the fundamental ability to use language, which comprises:
   (a) the linguistic process of creating an internalized knowledge form of input binary strings via the process of "signature compression of binary strings"; and
   (b) the linguistic process of syntactical and lentactical decoding of internal knowledge modules by the process of "phrase rcognition" allowing partial matches and included "noise" terms; and
   (c) the linguistic process of writing a multidimensional directed graph to self-organize a complex multidimensional network of objects with directed characteristics by the process of "Groak" which consists of the process;
      (1) mark all objects that refer to defined concepts as level one,
      (2) recursively mark all objects that are not marked AND that have only references to lower levels as resolved at the current level, continue until no object changes status before moving to the next level,
      (3) terminate when no object changes status for a level; and
   (d) the linguistic process of linking objects and removing symbolic references to "Bind" a template by the organization directed by "Groak", to produce a new object that has attributes of the parent objects but may be manipulated as a single symbolic reference.

2. In self-organising planning and manufacturing systems, the method of connecting and operating the resources and assets of such a system by the "exclusive virtual overlay process" wich comprises:
   (a) instantly reconfiguring the resources and assets of a system by transferring exclusive and privledged control to an executive control created by linking a knowledge template to the instantaneous library of functions existing in the system; and
   (b) the "virtual computer kernel" which is the instanteous inventory of functions, resources, and capabilities of the system (without a central control program), and which provides a means of translating knowledge templates and information into other forms of manufactured objects (including data); and
   (c) the operation of "Spore" causes the active and essential knowledge templates and information of a specific self-organising planning and manufacturing system to be manufactured into a non-volatile media thus causing an ordinary collection of components in a manufacturing system to become a self-organising planning and manufacturing system (autogeneric system); and
   (d) the operation of the "Silicon scribe" that converts high level language descriptions into physical components that perform as directed by the source description, thus closing the manufacturing loop and allowing autogeneric systems to plann and manufacture other complex systems, even reproducing or creating copys of themselves that incorporate external knowledge and abilities; and
   (e) the operation of the primary linguistic resource in the virtual computer kernel, the "unified parser", which combines the functions of a token recognizer, and a syntax recognizer, and a numeric translator into a single module that converts an input binary string into a stack of symbols and numbers that may be used by other knowledge based modules; and
   (f) the operation of the virtual computer kernel requires that there be used throughout each part of the system a consistent simple organization of data called "Gosamer" that packages each data object with a control block consisting of the minimum of (1) the symbolic name of the object, and (2) the size of the object, additional control information is imbedded in the object to detect any corruption, and extra control information is required for serial transmission of objects and collections of objects.

* * * * *